(12) United States Patent
Hellner et al.

(10) Patent No.: US 6,496,398 B2
(45) Date of Patent: Dec. 17, 2002

(54) CONTENT ADDRESSABLE MEMORY

(75) Inventors: Gerhard Hellner, Sindelfingen (DE); Rolf Sautter, Bondorf (DE); Otto Martin Wagner, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/683,269

(22) Filed: Dec. 6, 2001

(65) Prior Publication Data

US 2002/0075713 A1 Jun. 20, 2002

(30) Foreign Application Priority Data

Dec. 15, 2000 (EP) ............................................. 00127575

(51) Int. Cl.[7] .......................... G11C 15/00; H04M 15/34
(52) U.S. Cl. .......................... 365/49; 365/203; 365/204; 365/230.03; 365/189.07
(58) Field of Search ........................ 365/230.01, 230.03, 365/203, 204, 49, 189.07

(56) References Cited

U.S. PATENT DOCUMENTS

| | | | | |
|---|---|---|---|---|
| 5,598,115 A | * | 1/1997 | Holst | ........................... 326/119 |
| 5,699,288 A | * | 12/1997 | Kim et al. | ...................... 365/49 |
| 5,870,324 A | | 2/1999 | Helwig et al. | .................. 365/49 |
| 5,936,873 A | * | 8/1999 | Kongetira | ...................... 365/49 |
| 6,128,207 A | * | 10/2000 | Lien et al. | ...................... 365/49 |
| 6,166,939 A | * | 12/2000 | Nataraj et al. | .................. 365/49 |
| 6,195,277 B1 | * | 2/2001 | Sywyk et al. | .................. 365/49 |
| 6,243,280 B1 | * | 6/2001 | Wong et al. | .................... 365/49 |
| 6,249,467 B1 | * | 6/2001 | Pereira et al. | ............... 365/200 |
| 6,262,907 B1 | * | 7/2001 | Lien et al. | ...................... 365/49 |

FOREIGN PATENT DOCUMENTS

| | | | | |
|---|---|---|---|---|
| JP | | 404247758 A | * | 9/1992 |
| JP | | 405298892 A | * | 11/1993 |
| JP | | 02000228090 A | * | 8/2000 |

* cited by examiner

Primary Examiner—Viet Q. Nguyen
(74) Attorney, Agent, or Firm—Anthony J. Canale; Robert A. Walsh

(57) ABSTRACT

The present invention relates to content addressable memory (CAM), particularly, to a CAM having its memory array, which contains a plurality of memory locations, being divided into at least a first and a second memory block (100, 102), whereby the first and second memory block (100, 102) are formed by a first and second portion of each of said memory locations, respectively. The CAM further comprises a first set of compare lines (115) and a first set-of match lines (116) associated to said first memory block (100), and a second set of compare lines (117) and a second set of match lines (118) associated to said second memory block (102), and pre-charge units (112, 114) for charging said match lines before a comparison operation. The present invention provides an improved CAM which allows flagging of memory locations of which the content only partially matches a given comparison value. This is achieved by a CAM according to the above features using the pre-charge state of the match lines (116, 118) as a logically valid state.

11 Claims, 2 Drawing Sheets

CONTENT ADDRESSABLE MEMORY

BACKGROUND OF THE INVENTION

1. Field of the Invention

The present invention generally relates to semiconductor memory, and more specifically relates to providing an improved content addressable memory (CAM).

2. Background of the Invention

Content addressable memory, also called "associative memory", is a type of storage device which includes comparison logic with each bit of storage. A data value is broadcast to all words of storage and compared with the data values in storage. Words that match are flagged in some way. Subsequent operations can then work on flagged words, e.g., read the flagged words out one at a time or write to certain bit positions in all of the flagged words. A CAM can thus operate as a data parallel processor, also referred to as SIMD processor (Single Instruction/Multiple Data). Moreover, content addressable memories are often used in caches and memory management units.

The content addressable memory described in U.S. Pat. No. 5,870,324 has two memory arrays D0' and D1' to store all memory locations. The memory array D0' contains two blocks D00 and D10. The block D00 stores the bit positions 0 to 11 of a first portion of the memory locations, whereas the block D10 stores the bit positions 0 to 11 of a second portion of the memory locations. The memory array D1' contains blocks D01 and D11, which store the bit positions 12 to 23 of the first and the second portion of the memory locations, respectively. A location with a width of 24 bits is therefore divided into two halves in the described CAM.

The memory arrays D0' and D1' are each electrically linked through bit line drivers and write heads S0' and S with the input lines B0 to B11 and compare lines CD0 to CD1, and with the input lines B12 to B23 and the compare lines CD12 to CD23, respectively. A read/write memory block E0' belongs to the memory array D0', whereas a read/write memory block E1' belongs to the memory array D1'. The read/write memory blocks E0' and E1' have both an enable circuit, which allows writing in a read/write cell of one of the blocks E0' or E1'. Each of the blocks D00, D01, D10 and D11 is linked through corresponding match lines MATCH00, MATCH01, MATCH10 and MATCH11 with an enable circuits. Each location having 12-bit positions of one of the blocks D00, D0, D10 and D11 thereby has a separate match line.

The match lines MATCH00 and MATCH01, or MATCH10 and MATCH11, are linked logically in an AND-operation in the enable circuits. Only when both of the match lines MATCH00 and MATCH01, or MATCH10 and MATCH11, indicate that the corresponding bit positions of the comparison data on the match line correspond to those bits stored in the blocks of a data word, the corresponding enable circuit gets activated for that location in the blocks in which the agreement was determined. The information of the agreement of the comparison data and a stored data word is then flagged by writing into a corresponding read/write cell of one of the read/write blocks E0' or E1'. This information can then be read out through output lines Out0 and Out1 which are linked with the read/write blocks E0' or E1' through output drivers. The enable circuit, the logical AND-operation of the match lines and the read/write cell of the memory block E0' is implemented for each memory location of the CAM.

BRIEF SUMMARY OF THE INVENTION

An object of the present invention is to provide an improved content addressable memory which will flag memory locations of which the content only partially matches a given comparison value.

A content addressable memory according to the present invention has at least one memory array having a number of memory locations. Each memory location has a predetermined number of memory cells, whereby each memory cell is able to store 1 bit of information. In the case of the memory locations having 16 memory cells, then each memory location is able to store 16 bits of information. Although 16 memory cells might form one memory location, this does not necessarily mean that all 16 memory cells forming one memory location have to be positioned adjacent to each other. It might rather be advantageous, e.g., for wiring reasons, to place memory cells side by side that belong to different memory locations.

The memory array is divided into at least a first memory block and a second memory block. It is acknowledged that, without departing from the spirit of the invention, the memory array might also be divided into more than two separate memory blocks. The first memory block is formed by a first portion of each of the memory locations and a second memory block is formed by a second portion of each of the memory locations. In other words, one part of the memory cells, e.g., the memory cells representing the lower 8 bits of the memory locations, are grouped to form the first memory block and another part of the memory cells, e.g., the memory cells representing the upper 8 bits of the memory locations, are grouped to form the second memory block.

The content addressable memory according to the present invention also has a first set and a second set of compare lines which are associated to the first and the second memory block, respectively. Compare lines are generally used to apply comparison values-to comparison units, one of which is associated to each memory cell. For example, the compare line carrying the compare signal representing the reference value of bit position 3 is connected to all comparison units associated to memory cells storing the bit position 3 in a memory location. Thus, there are as many logically different compare lines as there are bit positions in one memory location. However, physically there might be a higher number due to wiring constraints.

Furthermore, the content addressable memory includes a first and a second set of match lines, whereas the first set of match lines is associated to the first memory block, and the second set of match lines is associated to the second memory block. A match line generally combines the output of all comparison units belonging to one memory location. However, since, according to the present invention, each memory location is divided into at least two portions, two times as many match lines as there are memory locations are distinguished.

Pre-charge units are provided for charging the match lines before a comparison operation. For performance reason the content-addressable memory according to the present invention is implemented using dynamic logic. Therefore, pre-charging of the match lines is necessary. The pre-charging brings the match line into a high-level state. During the following comparison operation, the match line keeps its high-level state if all bit positions of a memory location correspond to the respective bit positions of the comparison value. In case there is only one mismatch, the level of the match line is pulled down to a low-level state. The pre-charge units may be combined with other units, e.g., with a comparison unit, or may be distributed, e.g., parts connected to the match line, whereas other parts might be connected to the comparison unit. The pre-charge units may even not directly cause the match line to go into the pre-charge-state, as it will be apparent from the detailed description of a preferred embodiment below.

In order to allow that a match of only a subset of all bit positions of a memory location with the respective comparison value generates a match signal, the results of the comparison of the first memory block and the result of the comparison of the second memory block are logically combined. In the above example, in which a 16 bit wide memory location is divided into a lower and an upper 8 bit portion, a partial match of either the lower 8 bits or the upper 8 bits might generate a match signal, depending on how the results of both comparisons are combined. In the case of only the upper 8 bits are required to match, the result of the lower 8 bits may be neglected. This can be implemented by a combination logic being present for each pair of match lines, whereby the combination logic is controlled by select signals indicating which portion of the contents of a memory location must match.

Alternatively, the content addressable memory uses the pre-charge state of the match lines as a logically valid state, which leads advantageously to a reduction in the number of physical conductor lines which have to be provided in the circuit layout.

In a preferred embodiment of the content addressable memory according to the present invention, a first select signal line, a first functional unit, a second select signal line and a second functional unit are provided, whereby the first select signal line is connected to an input terminal of the first functional unit and the second select signal line is connected to an input terminal of the second functional unit. The functional units determine under which circumstances the comparison of one or the other memory block gets neglected. Of course, there is still the possibility that the whole content of a memory location has to match to the reference value. The state in which both comparison results are ignored might be used as a 'general reset' for output registers or latches storing the result of a comparison.

Furthermore, the output of the first functional unit is connected to the pre-charge units associated to the first memory block and, correspondingly, the output of the second functional unit is connected to the pre-charge units associated to the second memory block.

In addition, the functional units are configured to keep the respectively connected pre-charge units in a pre-charged state during the comparison operation when the associated select signal line shows a predetermined level. In other words, when a comparison of one memory block needs to be ignored, then the match line is forced by the functional unit and the pre-charge unit to the stay in the pre-charge state also during the comparison phase. Thus, according to the present invention, the precharge state is under certain conditions considered to be the valid logical state representing a match of all bit positions of the respective memory block. Therefore, if the comparison of a portion of bit positions that has to be ignored behave as if it was a match condition, only a mismatch in a bit position of the other portion could cause an overall mismatch. Hence, the match line pairs may be connected to each other without providing a combination logic for each pair of match lines. Instead, only one functional unit is needed for each memory block, i.e., two functional units for the example above.

In another preferred embodiment, the compare lines are connected to respective pre-charge units associated with the related match line. In addition, each pre-charge unit may have two output lines and may be configured to generate a true-signal and a complement-signal formed from the respective compare line signal when the output signal of the associated functional unit has a first level, and may generate the same signal on both output lines when the output signal of the associated functional unit has a second level.

Each functional unit may have other input terminals connected to a clock signal line. Advantageously, each functional unit may be configured to generate an output signal of a first level causing the respective pre-charge units to stay in a pre-charge state when the respective select signal has a predetermined level, independent from the clock signal level.

BRIEF DESCRIPTION OF THE SEVERAL VIEWS OF THE DRAWINGS

The present invention, as well as further objectives, and advantages thereof, will be described with reference to the following detailed description of an illustrative embodiment when read in conjunction with the accompanying drawings, wherein.

DETAILED DESCRIPTION OF THE INVENTION

Figure 1:
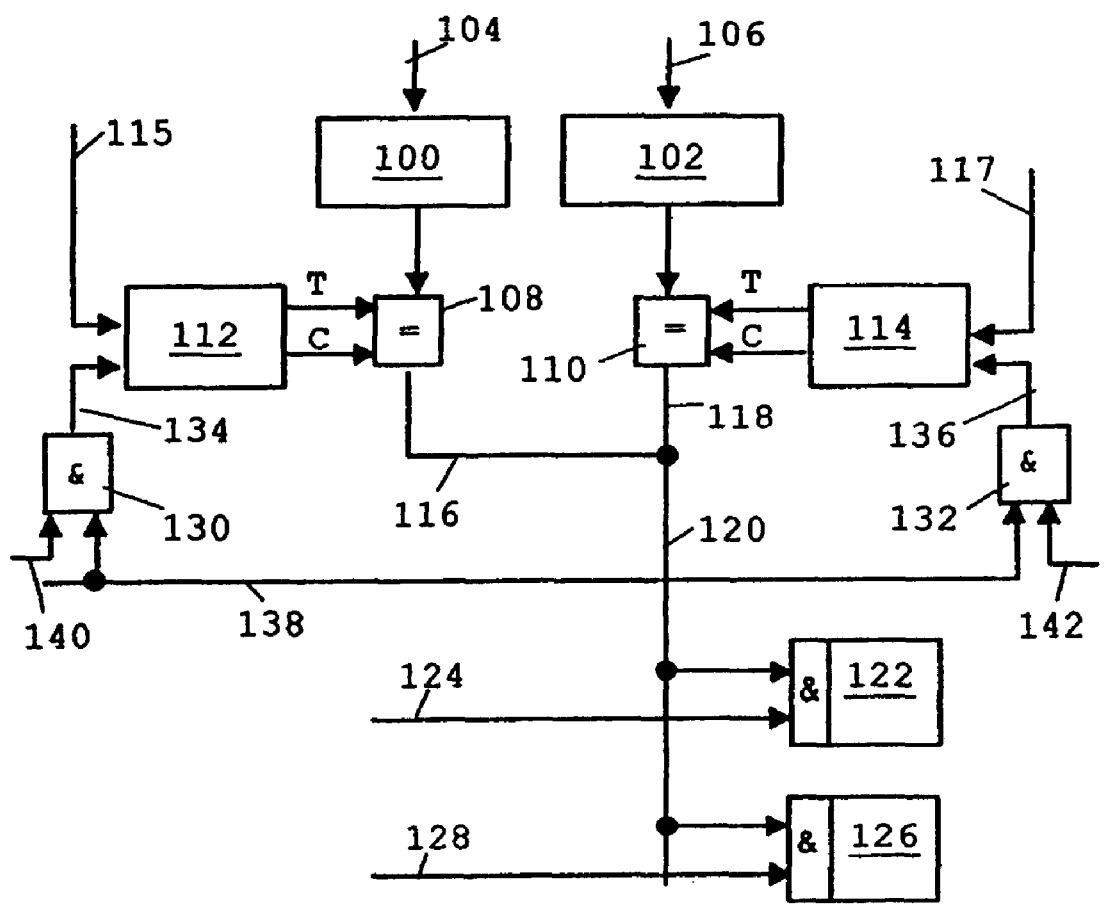
FIG. 1 shows a logical diagram of a portion of a content addressable memory in accordance with the present invention.

Referring to FIG. 1, a logical diagram of a portion of a content addressable memory in accordance with the present invention is shown. The content addressable memory has a first memory block 100 and a second memory block 102, both forming a memory array (not shown). For the sake of clarity, only single data lines are shown in the drawing of FIG. 1. However, it is known that the single lines represent a number of lines, since each memory block is able to store more than one bit of information in each of its memory locations. However, each memory block is able to store the same amount of memory locations, but the number of bit positions stored in each memory block may be different.

The first memory block 100 has an input terminal 104 for inputting data to be stored at a predetermined memory location of the first memory block 100. Correspondingly, the second memory block 102 has an input terminal 106 for inputting data to be stored at a predetermined memory location of the second memory block 102. A first comparison unit 108 is connected with its input terminal to an output terminal of a memory cell (not shown) of the first memory block 100. The first comparison unit 108 represents a number of first comparison units, since each memory cell is provided with a comparison unit. Accordingly, a second comparison unit 110 is connected with its input terminal to an output terminal of a memory cell (not shown) of the second memory block 102, whereby the second comparison unit 110 represents a number of second comparison units.

The first comparison unit 108 receives two more input signals via respective input terminals from a first pre-charge unit 112, and the second comparison unit 110 receives two more input signals via respective input terminals from a second precharge unit 114. The pre-charge units 112 and 114 according to the present embodiment combine a regular true-and-complement-generator with additional logic for controlling the pre-charge state of the first and second comparison units 108 and 110. Alternatively, the pre-charge units 112 and 114 may only generate either a true or a complement signal in the case that the comparison unit 110 is a NAND-cell or AND-cell and not an Exclusive-OR-cell as in the present embodiment. If a NAND-cell or an AND-cell is used, one signal is sufficient to force the comparison unit 110 into a pre-charge state.

In the present case, the pre-charge units 112 and 114 generate a true-signal and a complement-signal from a compare signal inputted through a compare signal line 115 and a compare line 117 respectively, when the respective control signal shows a first value. In case the respective control signal shows a second value, both output terminals of the pre-charge unit have the same signal level indicating the pre-charge state.

The output terminals of the first comparison units 108 associated to bit positions belonging to the same memory location are connected to each other by a first match line 116. Thus, the first match line 116 represents as many match lines as there are memory locations in the first memory block 100. The output terminals of the second comparison units 110 associated to bit positions belonging to the same memory location are connected to each other by a second match line 118. Therefore, the second match line 118 represents as many match lines as there are memory locations in the second memory block 102. The first and the second match lines 116 and 118 are connected to a common match line 120 which represents as many match lines as there are memory locations in one of the memory blocks 100 and 102, respectively. For each distinguished match line, i.e., the first and second match line 116 and 118, a respective pre-charge unit 112 and 114 is provided.

The common match line 120 is connected to an input terminal of a first memory cell 122, that is part of a latch (not shown), i.e., a digital logic circuit used to store one or more bits. Furthermore, the first memory cell 122 includes a second input terminal connected to a first set value signal line 124 which causes the first memory cell 122 to store the information transmitted over the common match line 120 when the set value signal is active. Either immediately, or when the input goes inactive, the stored value is transferred to an output terminal (not shown) of the first memory cell 122. The output will then retain its value until the set value signal goes active again. The common match line 120 is also connected to an input terminal of a second memory cell 126, and the second memory cell 126 is also able to store information transmitted over the common match line 120 when a set value signal inputted over a second set value signal line 128 is active.

A first functional unit 130 generates the control signal to be transferred to all first pre-charge units 112 associated with the comparison units 108 of memory block 100 and a second functional unit 132 generates the control signal to be transferred to all second pre-charge units 114 associated with the comparison units 110 of memory block 102. The control signal is transmitted by a first control signal line 134 and a second control signal line 136, respectively.

According to the described embodiment, the functional units 130 and 132 each consists of an AND-gate having a common clock signal and respectively a first and second select signal as inputs. The clock signal is transferred through a clock signal line 138, which feeds all functional units 130 and 132 of the content addressable memory according to the present invention. The first select signal is transmitted via a first select signal line 140 to the first functional unit 130 which is associated with the first memory block 100. The second select signal is transmitted via a second select signal line 142 to the second functional unit 132 which is associated with the second memory block 102.

Figure 2:
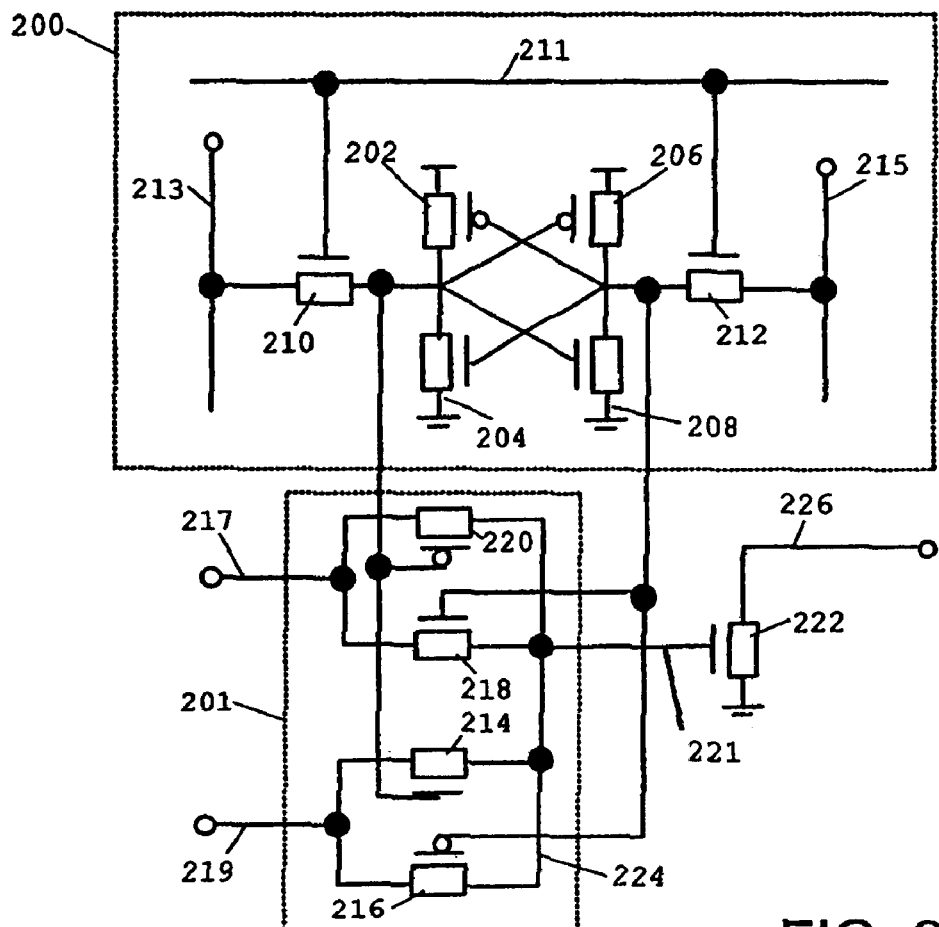
FIG. 2 shows a circuit diagram of a comparison cell as used in the content addressable memory according to the present invention.

FIG. 2 shows a circuit diagram of a comparison cell as used in the content addressable memory according to the present invention. The comparison cell includes a memory cell 200 and an Exclusive-OR-cell 201 performing the actual comparison. The memory cell 200 itself is formed by a flip-flop, i.e., a digital logic circuit that can be in one of two states which it switches between under control of its inputs, and can thus be considered as a one bit memory. Alternatively, the comparison cell may also consist of a NAND-cell, an AND-cell, or any other logic which may be used for a comparison operation.

The flip-flop consists of four transistors 202, 204, 206 and 208, and is connected to the transistors 210 and 212. The gates of the transistors 210 and 212 are linked with a word line 211. The word line selects a memory location consisting of several bit positions to be read or written. A terminal of the transistor 210 is linked with the bit line 213, while a terminal of the transistor 212 is linked with the complementary bit line 215. As it is known to a person skilled in the art, the flip-flop consisting of the four transistors 202, 204, 206 and 208, can be selected by a corresponding control signal of the word line 211 and the bit line 213 as well as their complements. A compare line 217 is linked with a connector of a transistor 218, while the complement of the compare line 217, namely the complement compare line 219, is linked with a terminal of a transistor 214.

Alternatively, if the comparison cell is formed by an NAND-cell or an AND-cell instead of an Exclusive-OR-cell, then only the true line 217 is necessary for performing the comparison and controlling the pre-charge state of the comparison cell.

The gate of the transistor 218 is linked with the mutual line of the transistors 206 and 208, while the gate of the transistor 214 is linked with the common line of the transistors 202 and 204 of the flip-flop. The transistors 216 and 220 are arranged in parallel to the transistors 214 and 218. The gate of the transistor 216 is linked with the gates of the transistors 202 and 204, while the gate of the transistor 220 is linked with the gates 206 and 208 of the flip-flop.

According to the circuit diagram of FIG. 2, the circuit is implemented using CMOS technology (Complementary Metal Oxide Semiconductor), i.e., a semiconductor fabrication technology using a combination of n- and p-doped semiconductor material to achieve low power dissipation. Any path through a gate through which current can flow includes both n- and p-type transistors. Only one type is turned on in any stable state so there is no static power dissipation and current only flows when a gate switches in order to charge the parasitic capacitance.

The transistors 202, 206, 216 and 220 are conductive with a potential of 0 volts at the gate. The remaining transistors depicted in FIG. 2 are not conductive with a 0 volt potential at the gate. The transistors 214 and 218 are linked to one another through a result line 221, combining the results of Exclusive-OR-cell. The result line 221 is in turn linked to the gate of a transistor 222.

The level on the result line 221 is low when the signal on the compare line 217 agrees with the data-item stored in the memory cell 200. Correspondingly, the signal level on the result line 221 is high when the data-item on the compare line 217 does not agree with the data-item stored in the flip-flop. The signal of the result line 221 is also applied to the gate of the transistor 222. Before a comparison operation, the match line 226 is pre-loaded into a high level. If the comparison signal agrees with the data-item stored in the memory cell 200, then the result is a low signal level on the result line 221 which causes the transistor 222 to not remain conductive. For each of the memory cells 200 of a memory location of the first block (cf. FIG. 1), an additional transistor (not shown) is connected to the match line 226.

A match circuit is realized by connecting one additional transistor for each comparison cell in parallel to the transistor 222. The gates of the additional transistors are linked with respective result lines of their respective memory cells (not shown). When, e.g., all 8 bits stored in one portion of a memory location agree with the corresponding bit positions applied by the respective compare lines, the level on the gate of transistors connected to the match line is low, so that none of the transistors become conductive. If there is no agreement between comparison data and stored data for one of the respective bit positions, then this results in one of the transistors connected to the match line becoming conductive. This causes the match line to change to a low level state, which indicates that no agreement between the comparison word and the data word exists. Accordingly, for each memory location of the memory array, two match lines 226 are provided. However, according to the present invention, the corresponding match lines are connected to each other as they would be one match line.

Figure 3:
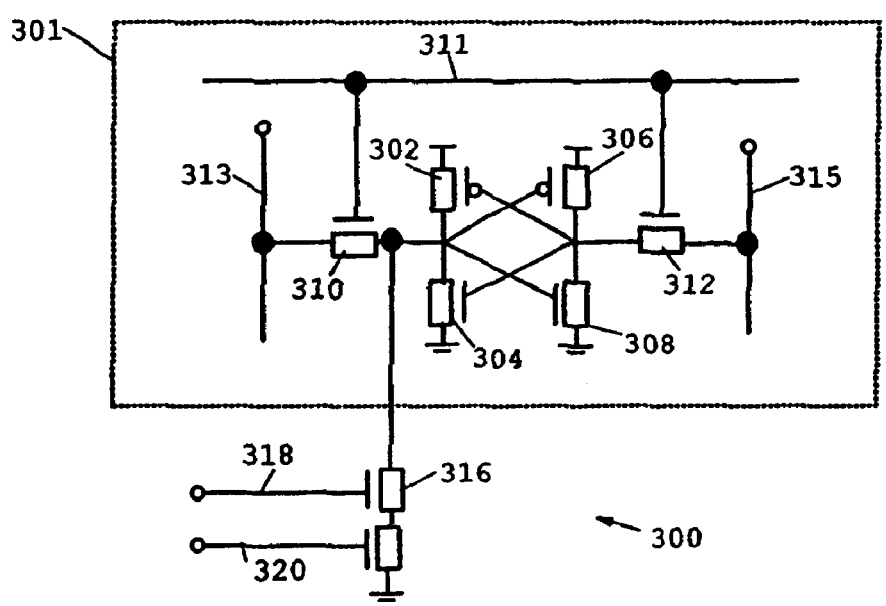
FIG. 3 shows a circuit diagram of an evaluation cell as used in the content addressable memory according to the present invention.

FIG. 3 shows a circuit diagram of an evaluation cell 300 as used in the content addressable memory according to the present invention. The evaluation cell 300 includes a memory cell 301, consisting of six transistors 302, 304, 306, 308, 310 and 312 which are arranged and connected as described for the transistors 202, 204, 206, 208, 210 and 212 of FIG. 2. The word line 311, the normal bit line 313, and the complement bit line 315 are used to select the memory cell 301 for reading or writing a data value.

Each match line, e.g., match line 226 of FIG. 2, is connected to at least one dedicated evaluation cell 300 over the gate of a transistor 316. In FIG. 3, the match line is shown as reference number 318. In order to ensure that a new result of a comparison written into the memory cell 301 is valid, a timing signal inputted via a timing signal line 320 is provided.

Figure 4:
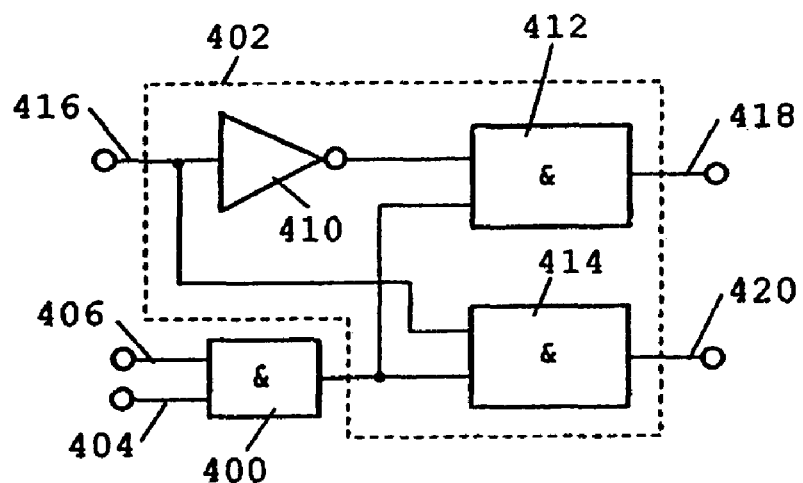
FIG. 4 shows a logical diagram of a functional unit and a pre-charge unit as used in the content addressable memory according to the present invention.

Referring to FIG. 4, a logical diagram of a functional unit 400 and a pre-charge unit 402 as used in the content addressable memory according to the present invention is shown. The functional unit 400 consists of an AND-gate having two input terminals. One input terminal is connected to a clock signal line 404. The transferred clock signal indicates at which instant of time a comparison is made. On the other terminal a select signal line 406 is connected providing a select signal indicating whether or not the connected pre-charge unit 402 should stay in the pre-charge state during the following comparison operation.

The pre-charge unit 402 as shown in FIG. 4 includes an inverter 410, a first AND-gate 412, and a second AND-gate 414. The input terminal of the inverter 410 is connected to a compare data line 416, whereas the output terminal of the inverter is connected to an input terminal of the first AND-gate 412. A second input terminal of the first AND-gate 412 is connected to the output terminal of the AND-gate forming the functional unit 400. The compare data line 416 is further connected to an input terminal of the second AND-gate 414, whereas a second input terminal of the second AND-gate 414 is as well connected to the output terminal of the AND-gate forming the functional unit 400.

The output terminal of the first AND-gate 412 is connected to a complement compare line 418 and the output terminal of the second AND-gate 414 is connected to a compare line 420.

According to the invention, the compare line 420 is connected to the compare line 217 of FIG. 2 and the complement compare line 418 is connected to the complement compare line 219 of FIG. 2. The pre-charge unit outputs on both output terminals a low level as long as either the clock signal line or the select signal line 406 shows a low level. In the opposite case, the input signal of the compare data line 416 is forwarded to the compare line 420 and the inverted signal of the compare data line 416 is forwarded to the compare complement line 418.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention. The following claims are intended to encompass all such modifications.

What is claimed is:

1. A content addressable memory comprising:

a memory array including a plurality of memory locations;

said memory array is divided into a first memory block formed by a first portion of said memory locations and a second memory block formed by a second portion of said memory locations;

a first plurality of compare lines and a first plurality of match lines associated with said first memory block, and a second plurality of compare lines and a second plurality of match lines associated with said second memory block; and, a first pre-charge unit for charging said first plurality of match lines and a second pre-charge unit for charging said second plurality of match lines before a comparison operation, wherein said content addressable memory uses the pre-charge state of the match lines as a logically valid state.

2. The content addressable memory of claim 1, further comprising:

a first select signal line, a first functional unit, a second select signal line and a second functional unit, wherein said first select signal line is connected to an input terminal of said first functional unit, said second select signal line is connected to an input terminal of said second functional unit, the output of said first functional unit is connected to the first pre-charge unit associated with said first memory block, the output of said second functional unit is connected to the second pre-charge unit associated with said second memory block, and the functional units are configured to keep the respectively connected first and second pre-charge units in a pre-charged state during said comparison operation when the associated select signal line shows a predetermined level.

3. The content addressable memory of claim 1, wherein said first plurality of compare lines are connected to the first pre-charge unit, and said second plurality of compare lines are connected to the second pre-charge unit.

4. The content addressable memory of claim 2, wherein each of the first and second pre-charge units comprises two output lines, the two output lines configured to generate a true-signal and a complement-signal formed from the respective compare line signal when the output signal of said associated functional unit has a first level.

5. The content addressable memory of claim 2, wherein each of the first and second pre-charge units comprises two output lines, the two output lines configured to generate the same signal on both output lines when the output signal of said associated functional unit has a second level.

6. The content addressable memory of claim 2, wherein each of the first and second pre-charge units comprises one output line and is configured to generate alternatively a true-signal or complement-signal formed from the respective compare line signal when the output signal of said associated functional unit has a first level.

7. The content addressable memory of claim 6, wherein each of the first and second pre-charge units is configured to generate a predetermined output signal when the output signal of said associated functional unit has a second level.

8. The content addressable memory of claim 2, wherein each of the first and second functional units comprises an input terminal connected to a clock signal line.

9. The content addressable memory of claim 8, wherein each of the first and second functional units is configured to generate an output signal of a first level causing the respective first and second pre-charge units to remain in a pre-charge state when the respective select signal has a predetermined level independent of the clock signal level.

10. The content addressable memory of claim 1, wherein match lines corresponding to the same memory location are conductively connected to each other.

11. The content addressable memory of claim 1, wherein a first comparison unit is connected between said first pre-charge unit and said first plurality of match lines, and a second comparison unit is connected between said second pre-charge unit and said second plurality of match lines.

* * * * *